US009507230B2

(12) United States Patent
Song et al.

(10) Patent No.: US 9,507,230 B2
(45) Date of Patent: Nov. 29, 2016

(54) ARRAY SUBSTRATE, LIQUID CRYSTAL PANEL AND LIQUID CRYSTAL DISPLAY (71) Applicants: BOE TECHNOLOGY GROUP CO., LTD., Beijing (CN); BEIJING BOE DISPLAY TECHNOLOGY CO., LTD., Beijing (CN)

(72) Inventors: Yongzhi Song, Beijing (CN); Jianshe Xue, Beijing (CN); Zhaohui Hao, Beijing (CN); Seung Moo Rim, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 117 days.

(21) Appl. No.: 14/611,616

(22) Filed: Feb. 2, 2015

(65) Prior Publication Data

US 2015/0146127 A1 May 28, 2015

Related U.S. Application Data (62) Division of application No. 13/197,099, filed on Aug. 3, 2011, now abandoned.

(30) Foreign Application Priority Data

Aug. 4, 2010 (CN) .......................... 2010 1 0245711

(51) Int. Cl.
G02F 1/1368 (2006.01)
G02F 1/1362 (2006.01)
(Continued)

(52) U.S. Cl.
CPC ....... *G02F 1/136286* (2013.01); *G02F 1/1368* (2013.01); *G02F 1/134363* (2013.01);
(Continued)

(58) Field of Classification Search
CPC ........... G02F 1/1368; G02F 1/136286; G02F 1/134336; G02F 1/134309
See application file for complete search history.

(56) References Cited

U.S. PATENT DOCUMENTS 8,120,720 B2 2/2012 Liu et al.
2004/0075780 A1 4/2004 Lee
(Continued)

FOREIGN PATENT DOCUMENTS

CN 1492273 A 4/2004
CN 1797081 A 7/2006
(Continued)

OTHER PUBLICATIONS

USPTO NFOA dated Jan. 28, 2013 in connection with U.S. Appl. No. 13/197,099.
(Continued)

Primary Examiner — Richard Kim
Assistant Examiner — Kendrick Hsu
(74) Attorney, Agent, or Firm — Ladas & Parry LLP (57) ABSTRACT An array substrate comprises a first substrate and a plurality of gate lines and a plurality of the data lines provided on the first substrate, the plurality of gate lines and the plurality of the data lines define a plurality of pixel units arranged into a matrix form. Each of the plurality of pixel units comprising: a first electrode having slits, comprising two or more regions where the slits have the different tilt degrees; a second electrode; and a thin film transistor switch, wherein the first electrode and the second electrode are used to form a horizontal electric field for driving liquid crystal molecules, the gate line and the thin film transistor switch are arranged between each two regions of the first electrode, and the thin film transistor switch is controlled by the gate line to operate each region of the first electrode.

18 Claims, 7 Drawing Sheets (51) Int. Cl.
*G02F 1/1343* (2006.01)
*H01L 27/12* (2006.01)
*G02F 1/1335* (2006.01)
*H01L 29/417* (2006.01)

(52) U.S. Cl.
CPC ......... *H01L27/12* (2013.01); *G02F 1/133512* (2013.01); *G02F 2001/134372* (2013.01); *H01L 27/124* (2013.01); *H01L 29/41733* (2013.01)

(56) References Cited

U.S. PATENT DOCUMENTS

| | | |
|---|---|---|
| 2005/0184940 A1 | 8/2005 | Oh et al. |
| 2005/0259206 A1 | 11/2005 | Son |
| 2006/0066798 A1 | 3/2006 | Hwang et al. |
| 2007/0070014 A1 | 3/2007 | Shih et al. |
| 2008/0084528 A1 | 4/2008 | Lu et al. |
| 2009/0103025 A1 | 4/2009 | Tanno et al. |
| 2009/0128726 A1 | 5/2009 | Tanno |
| 2009/0135358 A1 | 5/2009 | Jung et al. |
| 2009/0256158 A1 | 10/2009 | Xue |
| 2010/0073606 A1 | 3/2010 | Nishihara et al. |
| 2010/0149479 A1 | 6/2010 | Choi |
| 2010/0208161 A1 | 8/2010 | Sasaki et al. |

FOREIGN PATENT DOCUMENTS

| | | |
|---|---|---|
| CN | 101419371 A | 4/2009 |
| CN | 101441370 A | 5/2009 |
| CN | 101535881 A | 9/2009 |
| CN | 101561594 A | 10/2009 |

OTHER PUBLICATIONS

USPTO FOA dated May 10, 2013 in connection with U.S. Appl. No. 13/197,099.
USPTO AA dated Jul. 29, 2013 in connection with U.S. Appl. No. 13/197,099.
USPTO NFOA dated Sep. 20, 2013 in connection with U.S. Appl. No. 13/197,099.
USPTO FOA dated Jan. 14, 2014 in connection with U.S. Appl. No. 13/197,099.
USPTO NFOA dated Jul. 15, 2014 in connection with U.S. Appl. No. 13/197,099.
USPTO FOA dated Nov. 3, 2014 in connection with U.S. Appl. No. 13/197,099.

ARRAY SUBSTRATE, LIQUID CRYSTAL PANEL AND LIQUID CRYSTAL DISPLAY

BACKGROUND

Embodiments of the present invention relate to an array substrate, a liquid crystal panel, and a liquid crystal display.

Liquid crystal displays (LCDs) are currently common flat panel displays, and thin film transistor liquid crystal displays (TFT-LCDs) are the main kind of LCDs. According to the driving method, LCDs can be classified into Twisted Nematic (TN) type, In-Plane Switching (IPS) type, Fringe Field Switching (FFS) type and so on.

In IPS type and FFS type LCDs, a first electrode and a second electrode for forming a driving electric field (that is, a pixel electrode and a common electrode) are both formed on an array substrate. The difference lies in that the first electrode and the second electrode in the array substrate of the IPS type LCD are formed in the same layer, and the first electrode and the second electrode in the array substrate of the FFS type LCD are formed in the different layers. In general, a pattern of each first electrode has a plurality of slits, or may be called as a slit-shaped pattern having a plurality of elongated slits. In order to provide the wide view angle LCD, two-domain region design is generally adopted. In the two-domain region design, the first electrode has two regions, in one of which the tilt angle of slits is different from that of slits in the other regions, forming two domains. In each of the two regions, slits are tilted at a predetermined angle in the plane of the array substrate and the tilted angle of slits of the two regions are different from each other, and thus, the direction of the electric field formed by the first electrode and the second electrode in one of the two regions is different from that of the electric field formed by the first electrode and the second electrode in the other region so as to make liquid crystal molecules in the two regions to oriented to the different direction, and as a result, the optical complementary can be achieved between the two regions, and the wide view angle can be obtained.

Figure 1:
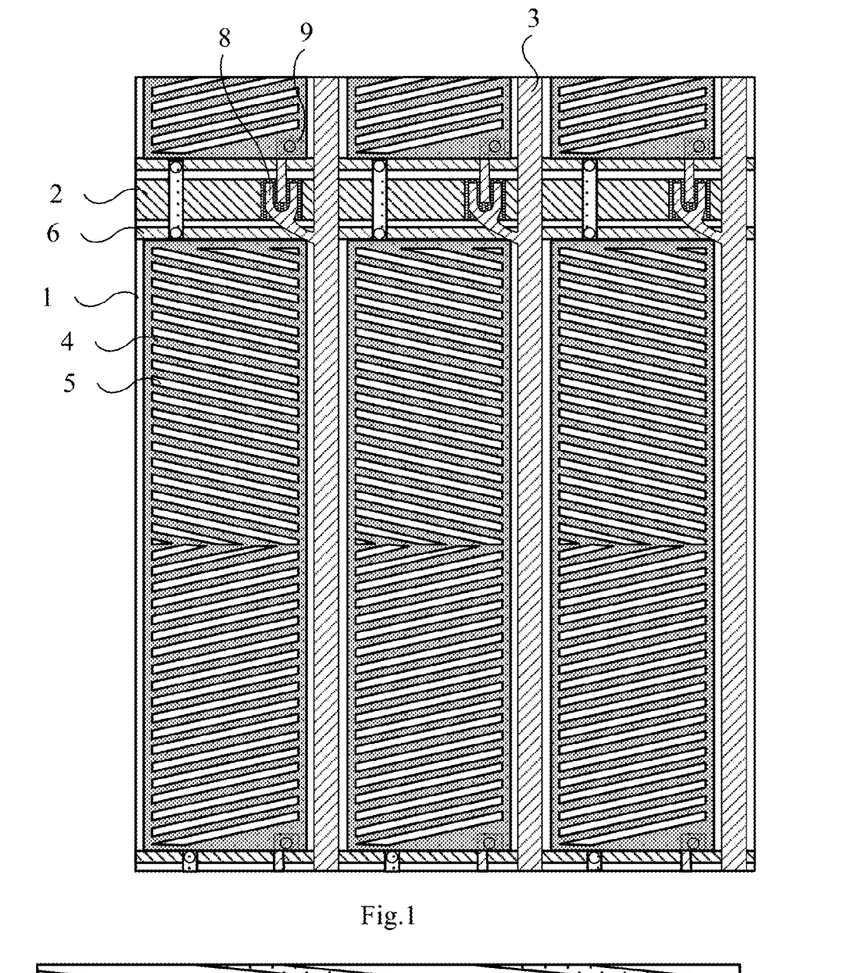
FIG. 1 is a top structural schematic view of a conventional FFS type array substrate.

FIG. 1 shows a top structural schematic view of a conventional FFS type array substrate, wherein gate lines 2 and data lines 3 are provided on a first substrate 1, and the data line 3 and the gate lines 2 cross each other, defining a plurality of pixel units arranged in a matrix form, and each of the pixel units comprises a first electrode 4 having slits, a second electrode 5, and a TFT switch. The second electrodes 5 are formed in the same layer as the gate lines 2, and are connected with each other via common electrode lines 6, for example, by using bridge lines and via holes. FIG. 1 does not show all of the common electrode lines 6 for connecting the second electrodes 5. The TFT switches are respectively connected with the gate lines 2, the data lines 3 and the first electrodes 4 with the gate electrodes, the source electrodes 8 and the drain electrodes 9. As shown, a part of the gate line 2 is used as the gate electrode for each TFT switch. Each of the first electrodes 4 corresponds to one pixel unit, and the pattern thereof has slits, and the slits are obliquely and mirror-symmetrically arranged by taking a midline of the pixel unit as a symmetry axis. For each pixel unit, the gate line 2 and the data line 3 cooperate to supply signal voltage to the first electrode 4 through the TFT switch, the common electrode line 6 supplies a common voltage to the second electrode 5, and the signal voltage and the common voltage are used to form a driving electric field for driving the liquid crystal molecules to orient to a direction, so that light can be selectively transmitted through a liquid crystal panel and an image can be displayed.

SUMMARY

An embodiment of the present invention provides an array substrate, comprising: a first substrate; and a plurality of gate lines and a plurality of the data lines provided on the first substrate, wherein the plurality of gate lines and the plurality of the data lines cross each other to define a plurality of pixel units arranged into a matrix form, and each of the plurality of pixel units comprises: a first electrode comprising two or more regions which have slits at different tilt degrees from each other; a second electrode; and a thin film transistor (TFT) switch, wherein in each pixel unit, the first electrode and the second electrode form a horizontal electric field for driving in operation, the gate line for the pixel unit and the thin film transistor switch are arranged between regions of the first electrode, and the thin film transistor switch is controlled by the gate line to operate each region of the first electrode.

An embodiment of the present invention provides a liquid crystal panel, comprising an array substrate according to any of embodiments of the present invention, a color filter substrate facing the array substrate, and a liquid crystal layer between the array substrate and the color filter substrate, wherein the color filter substrate comprises a second substrate and, on the second substrate, color filters and a black matrix which are formed.

An embodiment of the present invention provides a liquid crystal display, comprising an external frame, a driving device and the liquid crystal panel according to any of embodiments of the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

Figure 2:
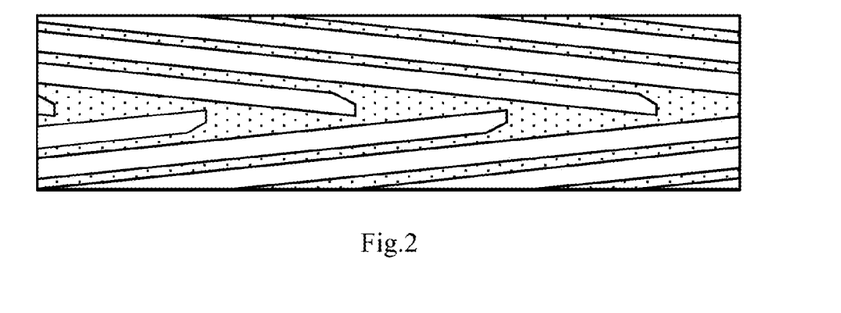
FIG. 2 is a top structural schematic view of a pixel unit in the conventional array substrate.
Figure 3:
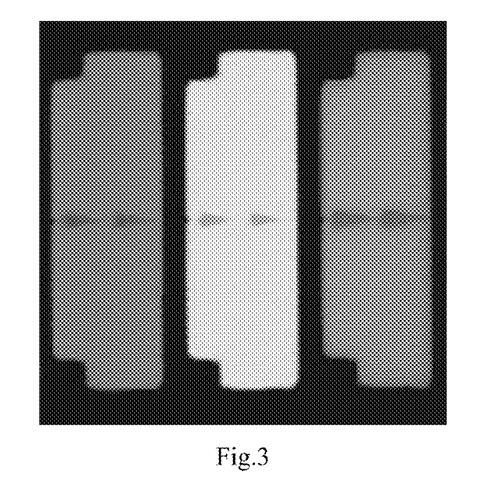
FIG. 3 is a display effect schematic view of the pixel unit in the conventional array substrate.

The inventors have found that when displaying an image, the array substrate as shown in FIG. 1 has the following disadvantages. As shown in FIG. 2, at the midline of each pixel unit, the tilted slits positioned on both sides thereof intersects, so the irregular slit pattern is formed around the midline of the pixel unit, and as a result, when an image is displayed, an accurate electric field for making liquid crystal molecules to orient cannot be formed at or around the midline of the pixel unit, and the liquid crystal molecules got out of control and the alignment of the liquid crystal molecules are disordered so that a dark spot may be formed in the pixel unit as shown in FIG. 3. Therefore, a LCD configured as shown in FIG. 1 has degraded display quality.

First Embodiment

Figure 4A:
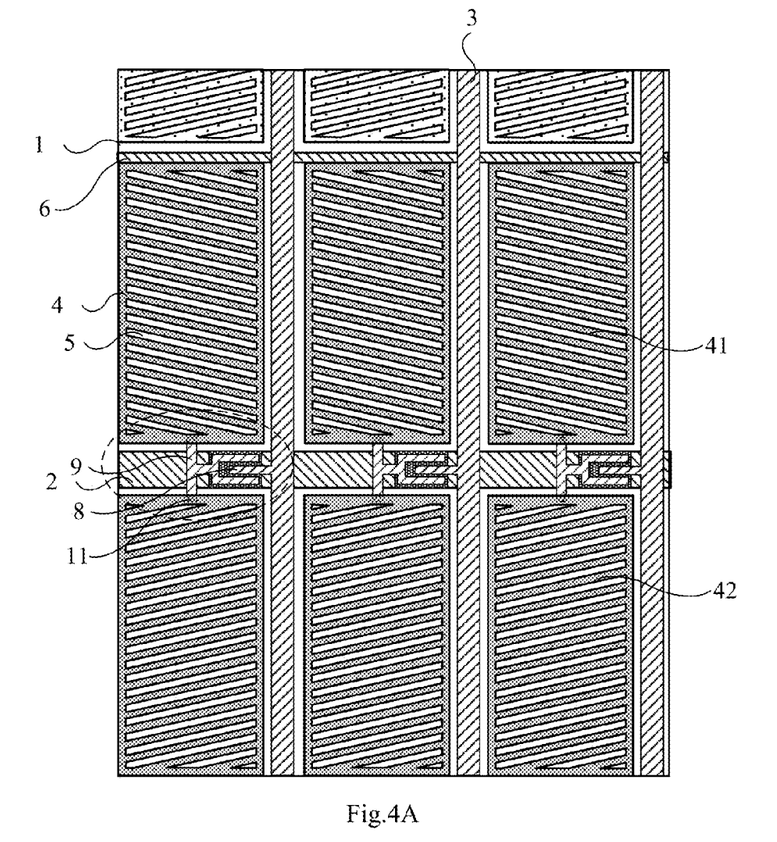
FIG. 4A is a top partial structural schematic view of an array substrate according to a first embodiment of the present invention.

FIG. 4A is a top partial structural schematic view of an array substrate according to a first embodiment of the present invention, and this top view do not show insulation layers for simplicity. The array substrate comprises a first substrate 1 and gate lines 2 and data lines 3 arranged on the first substrate 1. The data lines 3 and the gate lines 2 cross each other to define a plurality of pixel units arranged into a matrix form, and each of the plurality of pixel units comprises a first electrode 4 having slits, a second electrode 5, and a TFT switch, and the first electrode 4 and the second electrode 5 are used to form an electric field for driving liquid crystal molecules. Further, the array substrate may comprise common electrode lines 6 for connecting the second electrodes 5 which works as a common electrode. In each of the pixel units, the first electrode 4 having slits comprises a first region 41 and a second region 42; the gate line 2 and the TFT switch are arranged between the first region 41 and the second region 42 of the first electrode 4; the TFT switch comprises a gate electrode, a source electrode 8 and a drain electrode 9, and here the gate electrode is connected with the gate line 2 or a part of the gate line 2, the source electrode 8 is connected with the data line 3, the drain electrode 9 is respectively connected with the first region 41 and the second region 42. In the present embodiment, a part of the gate line 2 is used as the gate electrode; however, in another example, a portion protruding from the gate line 2 may be used as the gate electrode. The array substrate having the above mentioned structure may be of IPS type or FFS type; in the present embodiment, the FFS type is taken as a example for explaining, the second electrode 5 and the first electrode 4 are arranged in the different layers, and the second electrode 5 is disposed closer to the first substrate 1 than the first electrode 4 so as to form the FFS type array substrate. The second electrode 5 may be arranged in the same layer as the gate line 2 or the data line 3, or the first electrode 4 is disposed more closer to the first substrate 1 than the second electrode 5 as long as the second electrode 5 and the first electrode 4 are formed in the different layers. The second electrode 5 may be divided into two regions to respectively correspond to those of the first electrode 4; or the second electrode 5 may have one regions forming below the two regions 41 and 42 of the first electrodes 4.

Among conductive structures of the array substrate, such as the gate lines 2, the data lines 3, the common electrode lines 6, the first electrodes 4 having slits, the second electrodes 5 and the TFT switches, two or more are required to connect to each other by being arranged in the same layer or by using via holes, and with regard to these conductive structures that need not to be connected with each other may be insulated from each other by forming gaps in the same layer as thereof or by arranging insulation layers.

The present embodiment provides a typical structure, wherein the first electrodes 4 have slits, and each of first electrodes 4 corresponds to one pixel unit. The second electrode 5 has a plate-shaped pattern corresponding to one pixel unit, and a plurality of the second electrode 5 are arranged into a matrix on the first substrate 1 and connected with each other with common electrode lines 6. The second electrode 5 may be formed directly on the first substrate 1 in an individual patterning process or together with the gate lines 2. The material of the first electrode 4 and the second electrode 5 can be a transparent conductive material, such as indium tin oxide (ITO) or indium zinc oxide (IZO). The common electrode lines 6 can be formed in the same layer as the gate lines 2, in which case the common electrode lines 6 can be connected with each other by using bridge via holes formed in a gate insulation layers covering the gate lines 2. Alternatively, the common electrode lines 6 may be formed in the same layer as the data lines 3 and connected with the second electrodes 5 by via holes, or may be arranged in the same layer as the second electrodes 5 to connect the second electrodes 5 together. The data lines 3 and an active layer, the source electrode 8 and the drain electrode 9 of each TFT switch are formed above the gate insulation layer and then are covered and protected by a passivation layer. The first electrodes 4 are formed above the passivation layer and are each connected with the drain electrodes 9 by using via holes 11 formed in the passivation layer.

Figure 4B:
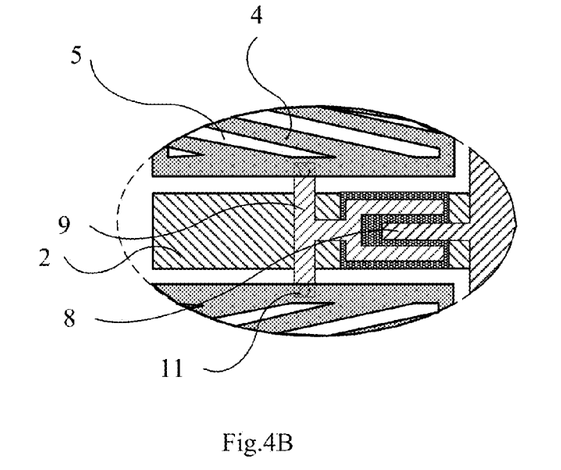
FIG. 4B is a enlarged structural schematic view of a circle in FIG. 4A

In the present embodiment, the gate line 2 and the TFT switch are arranged between each two regions of the first electrode 4 in each pixel unit but not between the adjacent two first electrodes 4 of different pixel units, thus dividing the first electrode 4 into the first region 41 and the second region 42, and the drain electrode 9 of the TFT switch is respectively connected with the first region 41 and the second region 42, as shown in FIG. 4B which is a enlarged structural schematic view of a circle in the FIG. 4A.

The above embodiment is especially adapted to the two-domain region design. In the two-domain region design as shown in FIG. 1, the two regions of the first electrode are connected with each other and formed into one integral body; however, in the two-domain region design of the present embodiment, the first electrode 4 comprises the first region 41 and the second region 42, and the two individual regions 41 and 42 are not connected with each other directly, and slits of the first region 41 and slits of the second region 42 are mirror-symmetrically arranged by taking the gate line 2 as a symmetry axis, and the angle between the slits of the first region 41 and the gate line 2 and the angle between the slits of the second region 42 and the gate line 2 are both larger than 0 degree and smaller than 90 degree.

In a two-domain region design where the first electrode of each pixel unit is divided into two regions, with the above mentioned embodiment, the gate line and the TFT switch are used to separate the two regions in each pixel unit so as to avoid occurring of a dark spot in the pixel unit due to liquid crystal molecules out of control at a boundary of the two regions having the different slit directions, and therefore the display quality is improved. The gate lines and the TFT switches of the array substrate are generally shaded by a black matrix from light, thus with the gate line and the TFT switch directly separating and connecting the two regions of the first electrode, not only the inverse influence on the display effect due to an additional pattern for connecting the two regions can be avoided, but also it is unnecessary to form an additional pattern in manufacturing, and further, the aperture ratio of the pixel unit of the array substrate is not influenced.

Second Embodiment

Figure 5:
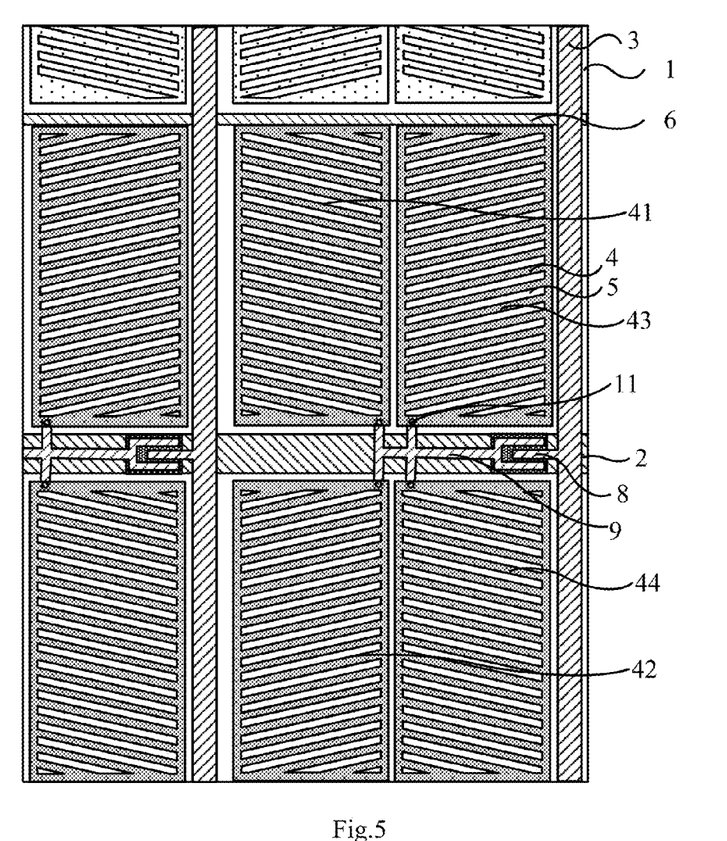
FIG. 5 is a top partial structural schematic view of an array substrate according to a second embodiment of the present invention.

FIG. 5 is a top partial structural schematic view of an array substrate according to a second embodiment of the present invention. The difference between the present embodiment and the first embodiment lies in that the first electrode 4 of each pixel unit can comprise more than two individual regions, and for example, the first electrode 4 may comprises four individual regions. The four regions are referred to as a first region 41, a second region 42, a third region 43 and a fourth region 44, as shown in FIG. 5, and a gate line 2 is respectively connected with each region of the first electrode 4 by a drain electrode 9 of a TFT switch. More specifically, the pattern of the drain electrode 9 are designed to have four branches for connecting each region of the first electrode 4 as shown in FIG. 5; in another example, two or four TFT switches may be provided to make the drain electrodes 9 thereof to connect respective regions of the first electrode. The number of the TFT switch may be determined according to the aperture ratio of the pixel unit, a driving current required by each region of the first electrode 4 and so on.

With the array substrate having the above mentioned structure, the gate line and the TFT switch are used to separate and connect the regions of the first electrode in each pixel unit, so that all regions of the first electrode in each pixel unit are maintained the at same potential level, and an additional pattern is not necessary for connecting each region, and thug, the influence on the display effect can he avoided.

Based on the above analysis, the array substrate according to embodiments of the present invention satisfy the following structural features: the first electrode having slits comprises two or more individual regions; the gate line and the TFT switch are provided between regions of the first electrode, or provided between two regions of the first electrode arranged along one direction. Each TFT switch comprises the gate electrode, the source electrode and the drain electrode, the gate electrode is connected with one gate line, the source electrode is connected with one data line, and the drain electrode is respectively connected with regions of the first electrode. The number, the size and symmetrical relationship of the regions are not limited.

The array substrate according to the embodiments of the present invention can be applied to an IPS type array substrate, in which the second electrode and the first electrode are formed in the same layer, the second electrode has slits and comprises two or more individual regions, slits of each region of the second electrode are provided to intersect slits of the corresponding region of the first electrode. By taking the second electrode having two regions as an example, the two regions can be referred to as a fifth region and a sixth region, slits of the fifth region are provided to intersect slits of the first region, and slits of the sixth region are provided to intersect slits of the second region so that the horizontal electric field may be formed over the array substrate. The common electrode lines may be formed in the layer in which the data lines, the gate lines or the first electrodes are formed, and connect the second electrodes directly or via hole connection structure. Slits of the first electrode and the second electrode may be mirror-symmetrically arranged to form a certain angle by taking the gate line as a symmetry axis. With the above mentioned embodiment, each region of the first electrode can be separated and connected, so the aperture ratio of each pixel unit is not influenced and the display quality can be improved.

Third Embodiment

Figure 6A:
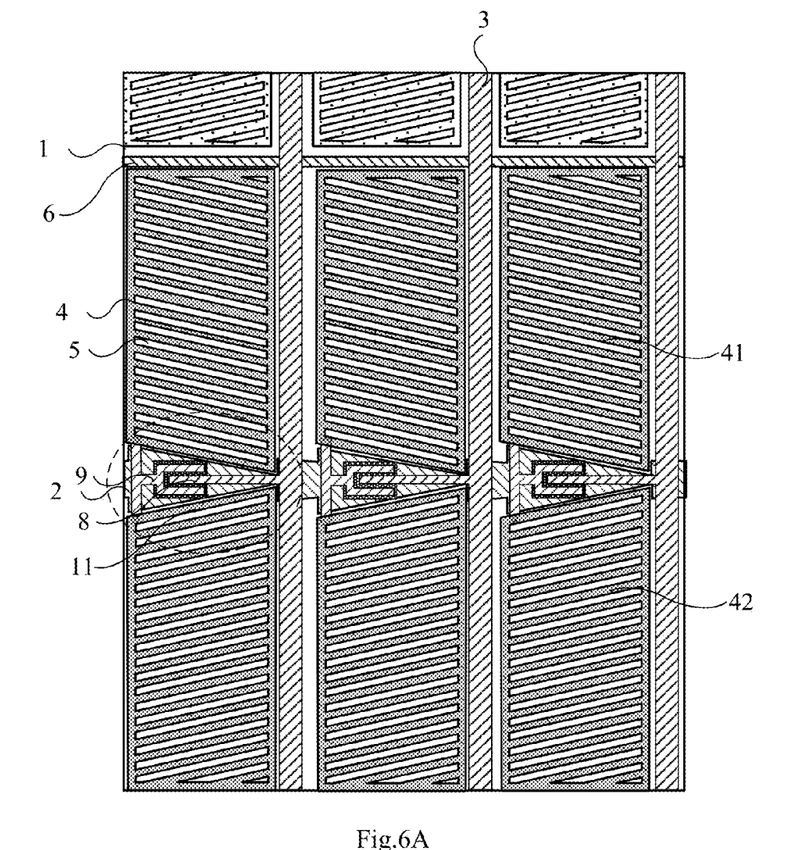
FIG. 6A is a top partial structural schematic view of an array substrate according to a third embodiment of the present invention.
Figure 6B:
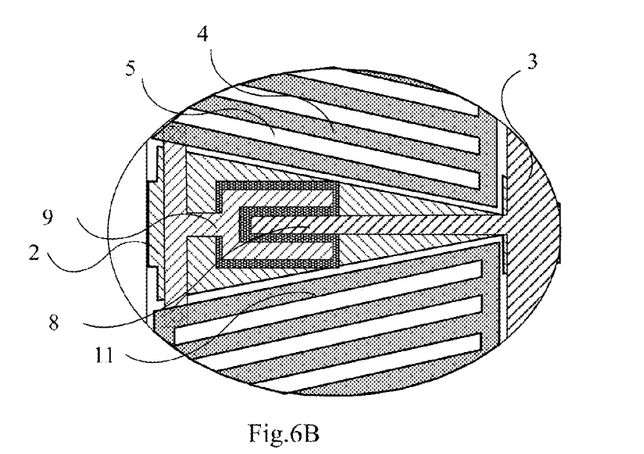
FIG. 6B is a enlarged structural schematic view of a circle in FIG. 6A.

FIG. 6A is a top partial structural schematic view of an array substrate according to a third embodiment of the present invention. The present embodiment may be configured on the basis of each of the previous embodiments; the edges the first region 41 and the second region 42 of each first electrode 4, which are adjacent to the corresponding gate line 2, are oblique, and these oblique edges are respectively parallel to slits of the respective regions. FIG. 6B is an enlarged structural schematic view of a circle in FIG. 6A.

In order to match the shape of the first electrode 4 of the pixel unit, the shape of the gate line 2 positioned between the first region 41 and the second region 42 is preferably in a triangle, and the shape of the triangle matches the oblique edges of the regions, that is, edges of the triangle are substantially parallel to the oblique edges, and thus, the gap of the first electrode 4 and the gate line 2 is reduced as far as possible, the aperture ratio of the pixel unit can be improved.

The first region and the second region of the first electrode in the present embodiment are of a right-angled trapezium shape. In addition, the shape that satisfies the condition that edges of the first region and the second region of the first electrode adjacent to the corresponding gate line are oblique edges and the oblique edges are respectively parallel to respective slits may be non-right-angled trapezium shape and the like. One pair of parallel sides of the trapezium adjacent to data lines are parallel to data lines, one of the other pair of sides adjacent to the gate line is as oblique edge parallel to the slits of the regions.

With the first electrode having the above mentioned shape, edges of the first electrodes of the adjacent pixel units may be parallel to each other, and in this case, upper sides of the parallel sides of the trapeziums of the first electrodes in the same column alternately face toward the data lines one both sides of this column of first electrodes, such as, the upper sides of the parallel sides of the trapeziums of the first electrodes in odd rows of the same column face toward the date lines on one side of this column first electrodes, and the upper sides of the parallel sides of the trapeziums of the first electrodes in even rows of the same column face toward the data lines on the other side of this column first electrodes.

Fourth Embodiment

Figure 7:
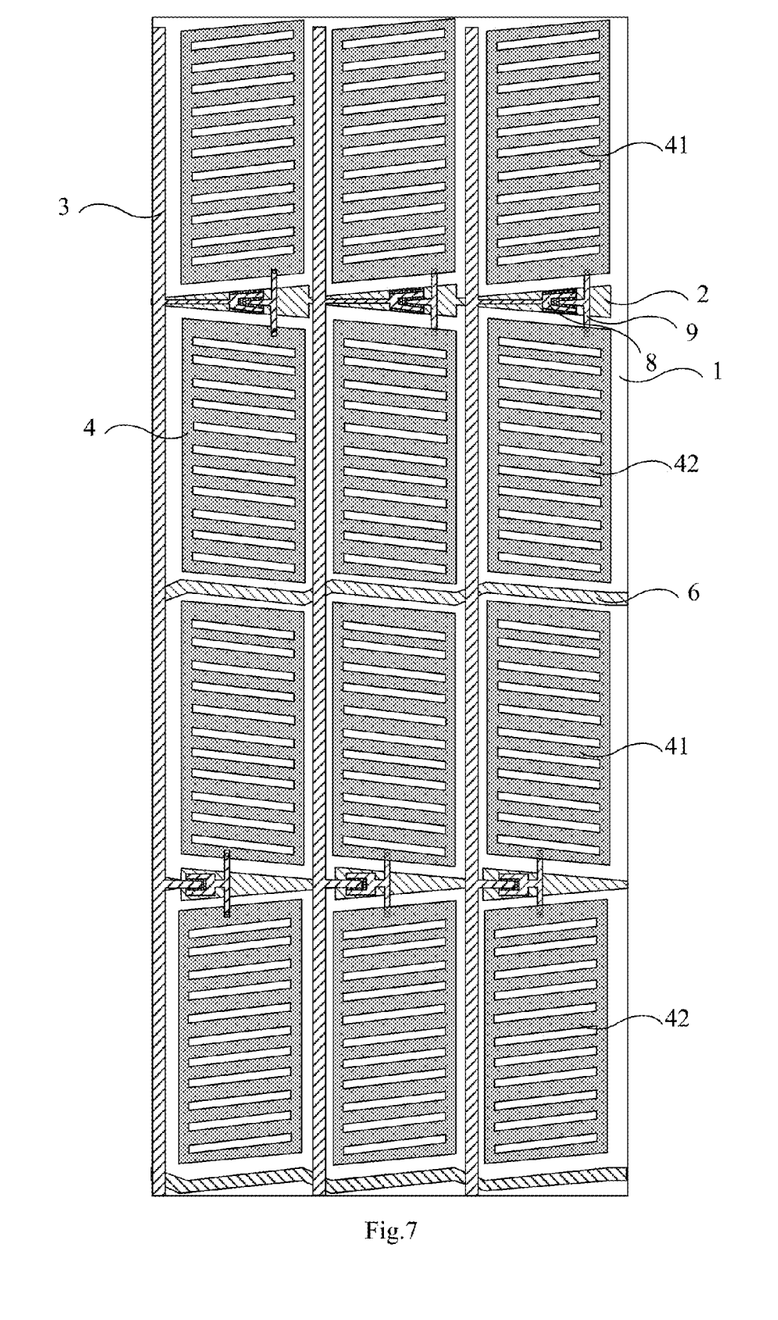
FIG. 7 is a top partial structural schematic view of an array substrate according to a fourth embodiment of the present invention.

FIG. 7 is a top partial structural schematic view of an array substrate according to a fourth embodiment of the present invention. The present embodiment may be configured on the basis of the previously described embodiments; the profiles of the first region 41 and the second region 42 of each first electrode 4 are in a parallelogram shape, and one pair of the parallel sides of each region in a parallelogram shape adjacent to the data line are parallel to data lines 3 and the other pair of the parallel sides thereof are respectively parallel to slits of this region, and preferably, patterns of the first electrodes 4 in the adjacent pixel units match each other, that is, all quadrangles are mirror-symmetrically arranged, and oblique edges of the first electrodes 4 between the perpendicularly adjacent two pixel units are parallel to each other.

The shape of wires positioned between the adjacent two pixel units may be correspondingly adjusted, for example, the shape of the common electrode line 6 is changed from the straight line to the fold line so as to adapt to the shape of the first electrode 4 and improve the aperture ratio of the pixel unit as far as possible. The shape of the gate line 2 positioned between the first region 41 and the second region 41 is preferably a triangle, and the shape of the triangle matches the oblique edges of the first electrode, that is, the bevel edge of the triangle is parallel to the oblique edge of the first electrode 4.

In order to match the shape of the TFT switch with the corresponding gate line 2 of a triangle shape, that is, the shape of the triangle gate electrode, the source electrode 8 and the drain electrode 9 of the TFT switch are respectively in a linear shape and a "U" shape, an opening of the U shape electrode is arranged toward a bevel edge of the triangle or to face away from the bevel edge of the triangle. For a TFT switch of the first row gate line 2 shown in FIG. 7, the drain electrode 9 is in a linear shape, and the source electrode 8 is in a U shape. Alternatively, for a TFT switch of the second row gate line shown in FIG. 7, the source electrode 8 is in a linear shape, and the drain electrode 9 is in a U shape. In the present embodiment, the TFT switches of all the pixel units in one row are connected with the data lines 3 on the same side of the pixel units, and there is no necessary to change the driving line configuration.

Fifth Embodiment

Figure 8:
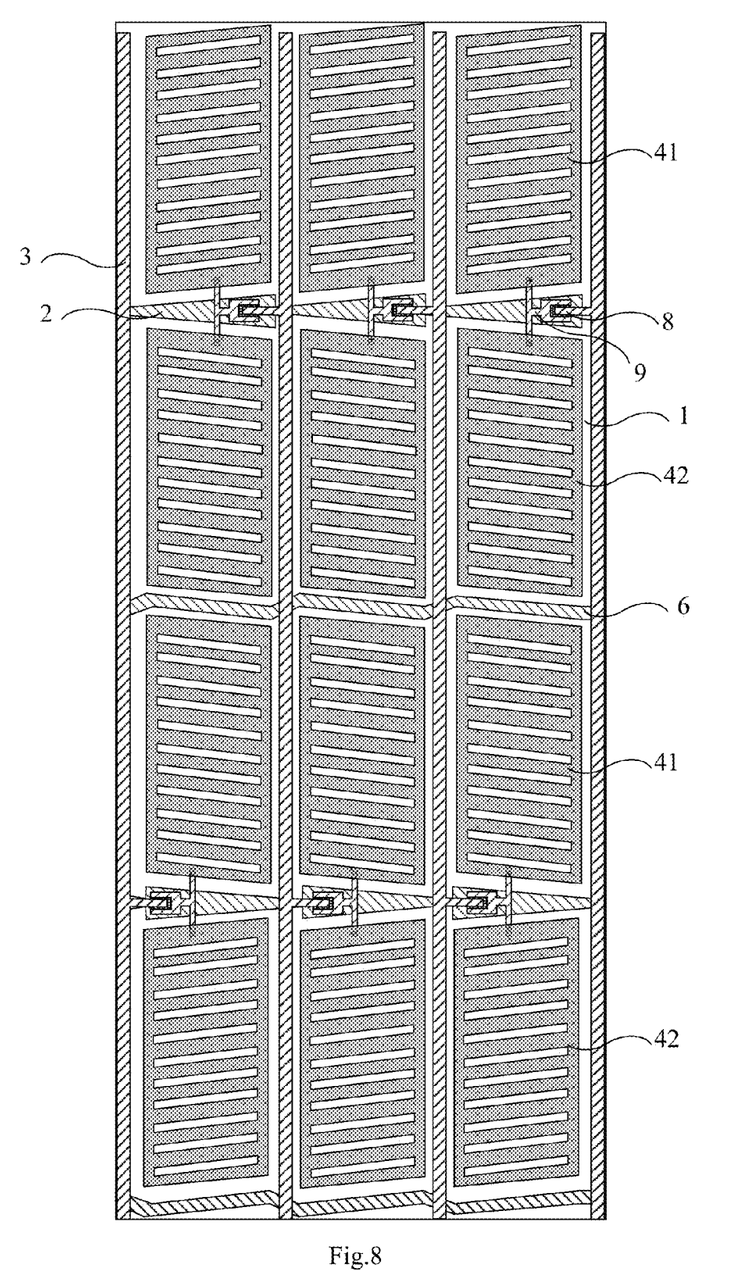
FIG. 8 is a top partial structural schematic view of an array substrate according to a fifth embodiment of the present invention.

FIG. 8 is a top partial structural schematic view of an array substrate according to a fifth embodiment of the present invention. The present embodiment may be configured on the basis of the previously described embodiments, and the difference between the present embodiment and the fourth embodiment lies in that the TFT switches of all pixel units in the same column are alternately connected with the data lines 3 on both sides thereof, and not connected with the data lines on the same side.

That is to say, with regard to one column of pixel units, the first row pixel unit is driven by the line on one side thereof, and the second row pixel unit is driven by the data line on the other side thereof, and row by row alternation is established. Such configuration design of the pixel units makes the pattern of the electrodes of the pixel unit match the patterns of the gate line and the TFT switch in order to reduce a gap between the electrodes and conductive lines as far as possible, so that the aperture ratio of the pixel unit can be improved. In this case, the driving method can be correspondingly adjusted to match the structure of the pixel units, that is, two column data lines are used to alternately drive one column of pixel units in displaying an image.

Sixth Embodiment

Figure 9:
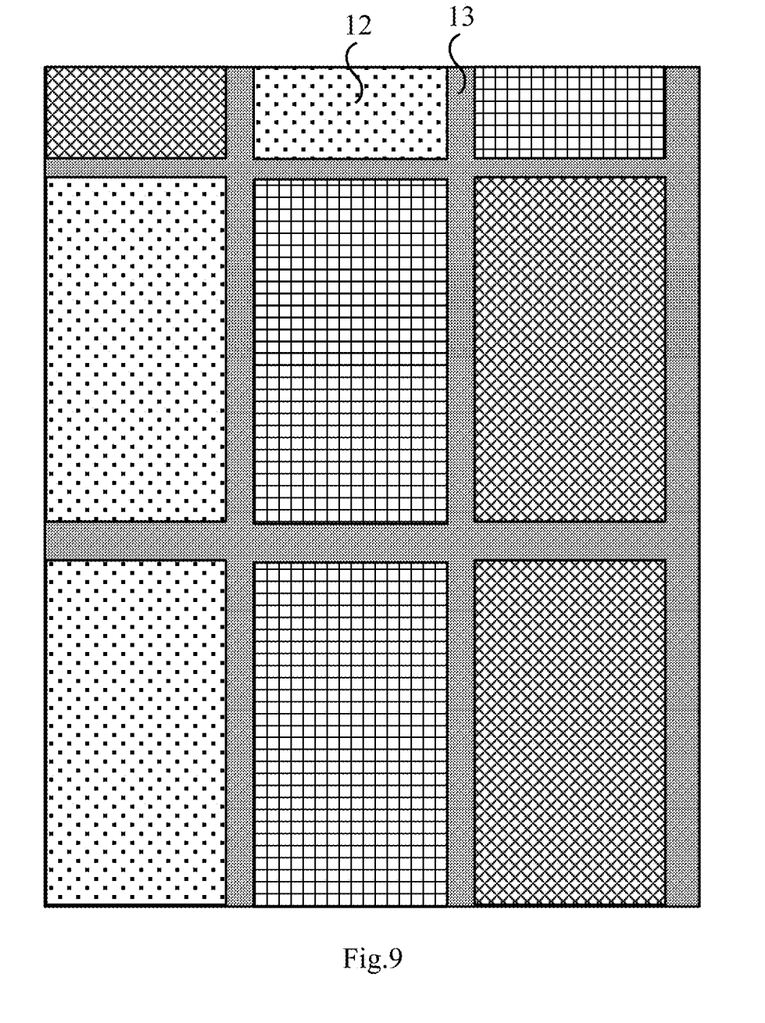
FIG. 9 is a top partial structural schematic view of a color filter substrate according to a sixth embodiment of the present embodiment.

FIG. 9 is a top partial structural schematic view of a color filter substrate according to a sixth embodiment of the present invention. The six embodiment provides a liquid crystal panel, and the liquid crystal panel comprises a color filter substrate and an array substrate of any of embodiments of the present invention, the two substrates are assembled together facing each other to form the liquid crystal panel, and a liquid crystal layer is filled between the two substrates. The color filter substrate comprises a second substrate and color filters 12 and a black matrix 13 provided on the second substrate. The pattern of the black matrix 13 corresponds to the patterns of the data lines 3, the gate lines 2 and the TFT switches on the array substrate. Further, parts of the black matrix 13 are arranged to correspond to positions between the adjacent first electrodes 4, as shown in FIG. 9. In FIG. 9, the regions having the same shadow patterns represent the color filters 12 of the same color, the regions of two color filter resins 12 of the same color constitutes one pixel unit to match the pixel unit having two-domain regions on the array substrate according to the above mentioned embodiments.

The black matrix shields the TFT switches from light to protect the TFT switches so as to avoid occurring of photosensing current caused by light radiating channels of the TFT switches, and simultaneously, because the TFT switches are positioned each at the boundary between regions having the different slit direction in one pixel unit, the region in which orientation of liquid crystal molecules become disordered is blocked by the black matrix. The black matrix blocking regions between the adjacent first electrodes can avoid the occurring of the color crosstalk between the adjacent pixel units.

An embodiment of the present invention further provides a liquid crystal display, comprising an external frame, a driving device and a liquid crystal panel according to any of embodiments of the present invention. The liquid crystal panel is mounted within the external frame, connected with the driving device and displays images under the control of the driving device. The liquid crystal display can be used for a computer or a TV set, for example.

With embodiments of the present invention, when a first electrode having slits on an array substrate need to be divided into different regions spaced from each other, a gate line and a TFT switch can directly be used to separate the different regions and connect the different regions, and thus, an additional connection pattern become unnecessary, and the aperture ratio is not disadvantageously influenced, and further, the influence of the abnormal pattern between regions on the display quality can be avoided. The improvement of the aperture ratio can in turn increase display area and luminance, and thus, the required luminance of a backlight can be reduced, and the energy can be saved. When the aperture ratio is increased by 10%, the power consumption of the backlight can be reduced by 15%.

The embodiments of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. An array substrate, comprising:
   a first substrate; and
   a plurality of gate lines and a plurality of the data lines provided on the first substrate, wherein the plurality of gate lines and the plurality of the data lines cross each other to define a plurality of pixel units arranged into a matrix form, and each of the plurality of pixel units comprises:

a first electrode comprising two or more regions which have slits at different tilt degrees from each other;
a second electrode; and
a thin film transistor (TFT) switch,
wherein in each pixel unit, the first electrode and the second electrode form a horizontal electric field for driving in operation, the gate line for the pixel unit and the thin film transistor switch are arranged between regions of the first electrode, and the thin film transistor switch is controlled by the gate line to operate each region of the first electrode,
wherein for two adjacent rows TFT switches, drain electrodes of one row TFT switches are in a linear shape and source electrodes thereof are in a U shape, and drain electrodes of the other row TFT switches are in a U shape, and source electrodes thereof are in a linear shape.

2. The array substrate of claim 1, wherein in each pixel unit the gate line and the thin film transistor switch are provided between two regions of the first electrode arranged along one direction.

3. The array substrate of claim 1, wherein the first electrode of each pixel unit comprises a first region and a second region which have slits at different tilt degrees from each other, the slits of the first region and the slits of the second region are mirror-symmetrically arranged by taking the gate line therebetween as a symmetry axis, and an angle between the slits and the gate line are larger than 0 degree and smaller than 90 degree.

4. The array substrate of claim 1, wherein the first electrode of each pixel unit comprises a first region, a second region, a third region and a fourth region which have slits at different tilt degrees from each other, the slits of the first region and the slits of the third region are mirror-symmetrically arranged by taking the gate line as a symmetry axis, and the slits of the second region and the slits of the fourth region are mirror-symmetrically arranged by taking the gate line as a symmetry axis.

5. The array substrate of claim 1, wherein an edge of each region of the first electrode adjacent to one gate line is an oblique edge, and the oblique edge is parallel to the slits of this region of the first electrode.

6. The array substrate of claim 5, wherein a shape of the gate line positioned between two regions of one first electrode is a triangle, and two edges of the triangle are parallel to the adjacent oblique edges of the regions of the first electrode.

7. The array substrate of claim 1, wherein edges of the first electrodes of adjacent pixel units are parallel to each other.

8. The array substrate of claim 1, wherein a profile of each region of each first electrode is in a parallelogram shape, one pair of parallel sides of the parallelogram shape adjacent to data lines are parallel to the data lines, and the other pair of parallel sides thereof are respectively parallel to the slits of respective region of the first electrode, and edges of the first electrodes of adjacent pixel units are parallel to each other.

9. The array substrate of claim 1, wherein a shape of the gate line positioned between two regions of each first electrode is a triangle.

10. The array substrate of claim 9, wherein a source electrode and a drain electrode of each TFT switch are respectively in a linear shape and a U shape, and an opening of the U shape is arranged toward a bevel edge of the triangle.

11. The array substrate of claim 1, wherein the TFT switches of the pixel units of one column are connected with the data line on the same side of the column.

12. The array substrate of claim 1, wherein the TFT switches of all the pixel units in a same column are alternately connected with the data lines on both sides of the column.

13. The array substrate of claim 1, wherein the second electrode and the first electrode of each pixel unit are provided in the different layers.

14. The array substrate of claim 1, wherein the second electrode and the first electrode of each pixel unit are provided in the same layer, the second electrode comprises two or more regions respectively corresponding to those of the first electrode and having slits at different tilt degrees from each other, and the slits of each region of the second electrode intersect the slits of the corresponding region of the first electrode.

15. A liquid crystal panel, comprising:
an array substrate according to claim 1,
a color filter substrate facing the array substrate; and
a liquid crystal layer between the array substrate and the color filter substrate;
wherein the color filter substrate comprises a second substrate and, on the second substrate, color filters and a black matrix which are formed.

16. The liquid crystal panel of claim 15, wherein the black matrix is arranged to correspond to the data lines, the gate lines and the TFT switches on the array substrate.

17. The liquid crystal panel of claim 16, wherein the black matrix further comprises portions corresponding to regions between adjacent pixel units on the array substrate.

18. A liquid crystal display, comprising:
an external frame,
a driving device, and
the liquid crystal panel according to claim 15.

* * * * *